United States Patent [19]
Brennan

[11] Patent Number: 5,343,421
[45] Date of Patent: Aug. 30, 1994

[54] SELF-BIASED FERROELECTRIC SPACE CHARGE CAPACITOR MEMORY

[75] Inventor: Ciaran J. Brennan, Arlington, Mass.

[73] Assignee: The Charles Stark Draper Laboratories, Inc., Cambridge, Mass.

[21] Appl. No.: 66,870

[22] Filed: May 25, 1993

Related U.S. Application Data

[63] Continuation-in-part of Ser. No. 630,038, Dec. 19, 1990, Pat. No. 5,140,548, and a continuation-in-part of Ser. No. 792,945, Nov. 15, 1991, and a continuation-in-part of Ser. No. 792,432, Nov. 15, 1991, and a continuation-in-part of Ser. No. 792,888, Nov. 19, 1991, and a continuation-in-part of Ser. No. 630,027, Dec. 19, 1990, Pat. No. 5,151,877.

[51] Int. Cl.$^5$ ............................................. G11C 11/22
[52] U.S. Cl. .................................. 365/145; 365/189.01
[58] Field of Search ............... 365/145, 149, 189.01, 365/117

[56] References Cited

U.S. PATENT DOCUMENTS

| | | | |
|---|---|---|---|
| 4,893,272 | 1/1990 | Eaton | 365/145 |
| 5,046,043 | 9/1991 | Miller | 365/145 |

Primary Examiner—Eugene R. LaRoche
Assistant Examiner—A. Zarabian
Attorney, Agent, or Firm—Joseph S. Iandiorio; Kirk Teska

[57] ABSTRACT

A ferroelectric space charge capacitor memory device includes a ferroelectric dielectric having a plurality of polarization states; a first electrode attached to the dielectric and establishing a first electric contact potential between the first electrode and the dielectric and a second electrode spaced from the first electrode and attached to the dielectric and establishing a second electric contact potential between the second electrode and the dielectric for generating a differential internal bias voltage on the dielectric which defines a number of capacitive levels, one representative of each of a corresponding number of polarization states and produces an electrical field which is less than the coercive electric field of the dielectric.

33 Claims, 6 Drawing Sheets

SELF-BIASED FERROELECTRIC SPACE CHARGE CAPACITOR MEMORY

RELATED APPLICATIONS

This application is a continuation-in-part of U.S. Ser. No. 07/630,038, "Ferroelectric Space Charge Capacitor Memory", filed Dec. 19, 1990, now U.S. Pat. No. 5,140,548; U.S. Ser. No. 07/792,945, "Ferroelectric Space Charge Capacitor Analog Memory", filed Nov. 15, 1991; U.S. Ser. No. 07/792,432, "Ferroelectric Space Charge Capacitor", filed Nov. 15, 1991; U.S. Ser. No. 07/792,888, "Ferroelectric Space Charge Capacitor Memory System", filed Nov. 15, 1991; and U.S. Ser. No. 07/630,027, "Ferroelectric Space Charge Capacitor Memory System", filed Dec. 19, 1990, now U.S. Pat. No. 5,151,877; all by the same sole inventor, Ciaran J. Brennan.

FIELD OF INVENTION

This invention relates to an improved ferroelectric space charge capacitor memory device, and more particularly to such a device which is self-biased.

BACKGROUND OF INVENTION

Ferroelectric space charge capacitor memory devices as recently revealed, for example in the applications cited above, include a pair of spaced electrodes with a ferroelectric dielectric between them. A coercive voltage is applied as a write signal to the ferroelectric dielectric to write the dielectric into a predetermined polarization state in the range from zero to maximum coerced polarization to establish proximate the interface between the dielectric and each electrode a space charge region having a charge opposite to that applied to the electrode with a neutral region between the space charge regions. The relative sizes of the neutral and space charge regions define the capacitance of the dielectric. The neutral region has an internal polarization field opposite that represented by the space charge regions. A bias voltage less than the coercive voltage is applied at a rate slower than the rate of space charge formation in order to define a capacitance level representative of a predetermined polarization state. A read signal is applied at a rate faster than the rate of space charge formation, and together with a bias voltage sums to less than the coercive voltage. In response to the read signal, a determination is made as to the capacitive level as to the level of the capacitance which represents a predetermined polarization state. These devices can be used in both analog and digital memory systems. In digital applications the dielectric is written into one of two polarization states representing the binary states. In these systems the biasing voltage is typically provided by an external power supply which adds to the cost, size and complexity of the overall system.

SUMMARY OF INVENTION

It is therefore an object of this invention to provide an improved ferroelectric space charge capacitor memory device which operates without external biasing.

It is a further object of this invention to provide a ferroelectric space charge capacitor memory device which is self-biased.

It is a further object of this invention to provide a ferroelectric space charge capacitor memory device which is less costly, smaller and less complex.

This invention results from the realization that a simpler, less costly, and smaller self-biased ferroelectric space charge capacitor memory device can be effected by providing a different contact electric potential between each of the two electrodes and the dielectric so that a differential internal bias voltage is developed using a number of techniques including using dissimilar material with dissimilar contact potential for each electrode; using an auxiliary element of dissimilar material between at least one of the electrodes and the dielectric; using a coating or a surface dopant on one or both of the electrodes or on the mating surfaces of the dielectric; or using a region of altered stoichiometry on one or both of the electrodes or the mating dielectric surfaces.

This invention features in a digital aspect a self-biased ferroelectric space charge capacitor memory device having a plurality of polarization states represented by a like plurality of different capacitive levels. There is a ferroelectric dielectric having a plurality of polarization states and a first electrode attached to the dielectric and establishing a first electric contact potential between the first electrode and the dielectric. There is a second electrode spaced from the first electrode and attached to the dielectric to establish a second electric contact potential between the second electrode and the dielectric for generating a differential internal bias voltage on the dielectric which defines two capacitive levels, one representative of each of two polarization states, and it produces an electric field which is less than the coercive electric field of the dielectric. There are means for applying a coercive voltage to the dielectric to write the dielectric into one of the two polarization states and to establish in each polarization state proximate the interface between the dielectric and the electrode a space charge region having a charge opposite to that applied to the electrode with a neutral region between the space charge region. The relative size of the neutral and space charge regions define the capacitance of the dielectric. The neutral region has an internal polarization field opposite to that represented by the space charge regions. There are means for introducing to the dielectric a read signal at a rate faster than the rate of space charge formation which together with the internal bias voltage is less than the coercive voltage; and there are means responsive to the introduction of the read signal to the dielectric for determining the capacitance level representative of one of the polarization states.

In a preferred embodiment the means for determining the capacitance may include means for detecting the displacement current transferred through the dielectric in response to the read signal. The two polarization states may include a first state in which the positive pole of the dielectric is proximate the first electrode and the negative pole is proximate the second electrode, and a second state in which the negative pole of the dielectric is proximate the first electrode and the positive pole is proximate the second electrode. The internal bias voltage may establish an electric field that increases the internal electric field and the size of the space charge region with a concomitant decrease in capacitance when it is added with the internal polarization field, and decreases the internal electric field and the size of the space charge region with a concomitant increase in the capacitance when it is subtractive with the internal polarization field. The read signal may momentarily induce through the dielectric a displacement current which is proportional to the capacitance representative of the polarization state of the dielectric. The electrode may be metal and the space charge regions may be in the dielectric. The electrodes may be semiconductors and the space charge regions may be at least partially in the electrodes. The first and second electrodes may include first and second electrode elements, respectively, which are of dissimilar material and dissimilar contact potentials. Or, at least one of the electrodes may include an auxiliary element of dissimilar material between the electrode element and dielectric to differentiate the contact potential from that of the other electrode. At least one of the electrodes may include an electrode element with a coating contacting the dielectric for establishing an electrical contact potential different from that of the other electrode, or the electrode element may contain a surface dopant for the same purpose. Or, at least one of the electrodes may include an electrode element having a region of altered stoichiometry. The dielectric may include on at least one of its surfaces engaged with the electrode a coating contacting the electrode for establishing an electric contact potential different from that of the other electrode. Or the dielectric may have a surface dopant or a region of altered stoichiometry for the same reason. The electrodes may be differentially alloyed to the dielectric for establishing different electric contact potential at each of the electrodes.

The invention also features a ferroelectric space charge capacitor memory device including a ferroelectric dielectric having a plurality of polarization states. There is a first electrode attached to the dielectric and establishing a first electric contact potential between the first electrode of the dielectric and a second electrode spaced from the first electrode and attached to the dielectric and establishing a second electric contact potential between the second electrode and the dielectric for generating a differential internal bias voltage on the dielectric which defines a number of capacitive levels, one representative of each of the corresponding number of polarization states, and also produces an electric field which is less than the coercive electric field of the dielectric. There are means for applying a write signal equal to or greater than the coercive voltage of the dielectric to write the dielectric into a predetermined polarization state in the range from zero to maximum coerced polarization and to establish proximate the interface between the dielectric and each electrode a space charge region having a charge opposite to that applied to the electrode with a neutral region between the space charge regions. The relative sizes of the neutral and space charge regions define the capacitance of the dielectric. The neutral region has an internal polarization field opposite to that represented by the space charge regions. There are means for introducing to the dielectric a read signal at a rate faster than the rate of space charge formation which together with the internal bias voltage is less than the coercive voltage. There are also means responsive to the introduction of the read signal to the dielectric for determining the capacitance level representative of a predetermined polarization state.

In a preferred embodiment the means for determining the capacitance may include means for detecting the displacement current transferred through the dielectric in response to the read signal. The means for applying may include means for varying the charge transferred by the write signal to vary the size of the space charge regions, the capacitance of the neutral region and the polarization of the dielectric. The means for varying may include means for changing the magnitude of the write signal. The internal bias voltage may establish an electric field and increase the internal electric field and the size of the space charge region with a concomitant decrease in the capacitance when it is additive with the internal polarization field, and decreases the internal electric field and the size of the space charge region with a concomitant increase in capacitance when it is subtractive with the internal polarization field. The read signal may momentarily induce through the dielectric a displacement current which is proportional to the capacitance representative of the polarization state of the dielectric. The electrodes may be metal and the space charge region may be in the dielectric. The electrodes may be semiconductors and the space charge regions may be at least partially in the electrodes. The electrodes may be of dissimilar material with dissimilar contact potentials, or one or both of the electrodes may include an auxiliary element of dissimilar material. At least one of the electrodes or one of the surfaces of the dielectric may include a coating or a surface dopant or altered stoichiometry for obtaining the desired difference in electric contact potential. Or, the electrodes may be differentially alloyed to the dielectric for the same purpose.

DISCLOSURE OF PREFERRED EMBODIMENT

Other objects, features and advantages will occur to those skilled in the art from the following description of a preferred embodiment and the accompanying drawings, in which.

Figure 1:
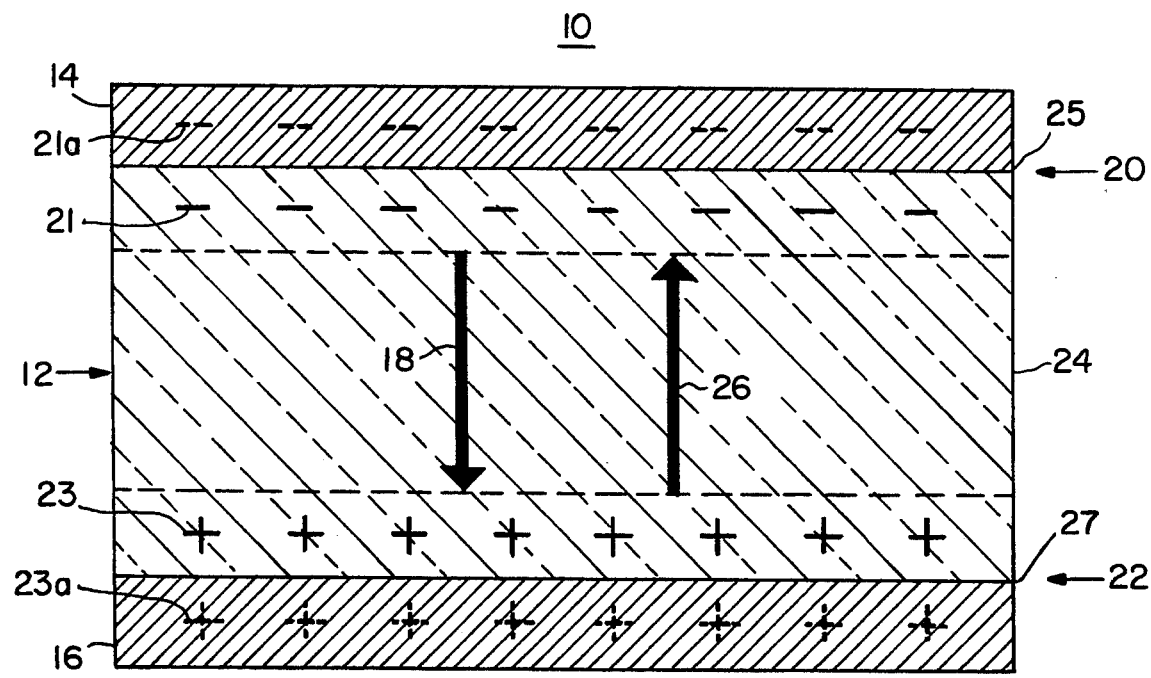
FIG. 1 is a schematic diagram of a ferroelectric space charge capacitance memory device according to this invention.

There is shown in FIG. 1 a ferroelectric space charge capacitor memory device 10 including a ferroelectric dielectric medium 12 disposed between a pair of spaced electrodes 14 and 16. Ferroelectric dielectric medium 12 may be a lead-zirconium-titanate or lead-titanate ferroelectric available from Raytheon, Ramtron, or Radiant Technologies. When an external electric potential is supplied across electrodes 14 and 16, an internal polarization field indicated by vector 18 is established in dielectric medium 12 by the alignment of the electric dipoles. This internal polarization field is in the same direction as the externally applied potential or voltage at electrodes 14 and 16. There results an accumulation of charge in space charge regions 20 and 22. If electrodes 14, 16 are metal, space charge regions 20, 22 are in dielectric 12 as indicated by the full line − and + signs 21, 23, respectively. If electrodes 14, 16 are semiconductor material, then space charge regions 20, 22 may be in both the electrodes 14, 16 and dielectric 12 as indicated by full line − and + signs 21, 23 and dashed − and − signs 21a, 23a. Space charge region 20 accumulates negative charges since it is proximate electrode 14 which has a positive potential applied to it, while space charge region 22 accumulates a positive charge since it is associated with electrode 16 that has a negative potential applied to it. The accumulations of space charge at the contacts produces an electric field 26 which opposes the remanent polarization.

A neutral region 24 occurs between space charge regions 20 and 22. The size of this neutral region 24 relative to the space charge regions establishes the capacitance value of the capacitor constituted by electrodes 14 and 16 with the dielectric material between them. As neutral region 24 becomes larger, so too does the capacitance of device 10. The size of the neutral region available to establish the capacitance value of device 10 varies inversely to the applied field. That is, as the field across electrodes 14 and 16 grows larger the neutral region 24 grows smaller, and so does the capacitance of device 10.

If the initial voltage or write voltage applied across electrodes 14 and 16 reaches the coercive voltage of dielectric 12, then a certain amount of polarization, the remanent polarization, remains even after the external electric potential is removed from electrodes 14 and 16. If it is later desired to read out device 10, that is, to determine its remanent state, it is only necessary to apply a bias voltage across the electrodes 14 and 16 which is less than the coercive voltage and then apply a small read pulse which will produce a current proportional to the value of the capacitance established in neutral region 24.

The self-biasing feature of this invention is indicated at the interface or junctions 25, 27 between each of electrodes 14,16, respectively, and dielectric 12. Because these two junctions 25,27 are made to have different electric contact potential there is an overall differential internal bias on dielectric 12. The effect of this bias can be seen by a comparison of FIG. 2, a depiction of the prior art capacitive hysteresis characteristic, and FIG. 3, a depiction of the capacitive hysteresis characteristic exhibiting the self-bias of this invention. The prior art capacitive hysteresis characteristic 30, FIG. 2, as applied to a digital memory device, shows two polarization states. The first is when the system moves from point 32 driven by a positive voltage through knee 34, leg 36 and toe 38, back along leg 40 to point 32. In that case, the polarization state shown in FIG. 1 occurs. If the write voltage instead is applied in the negative direction so that the system moves through knee 42, leg 44 and toe 46, and back up leg 48 to point 32, then the space charge regions will be charged oppositely from that shown in FIG. 1 and the internal polarization vector 18 will be reversed, to thereby establish the other polarization state.

Figure 2:
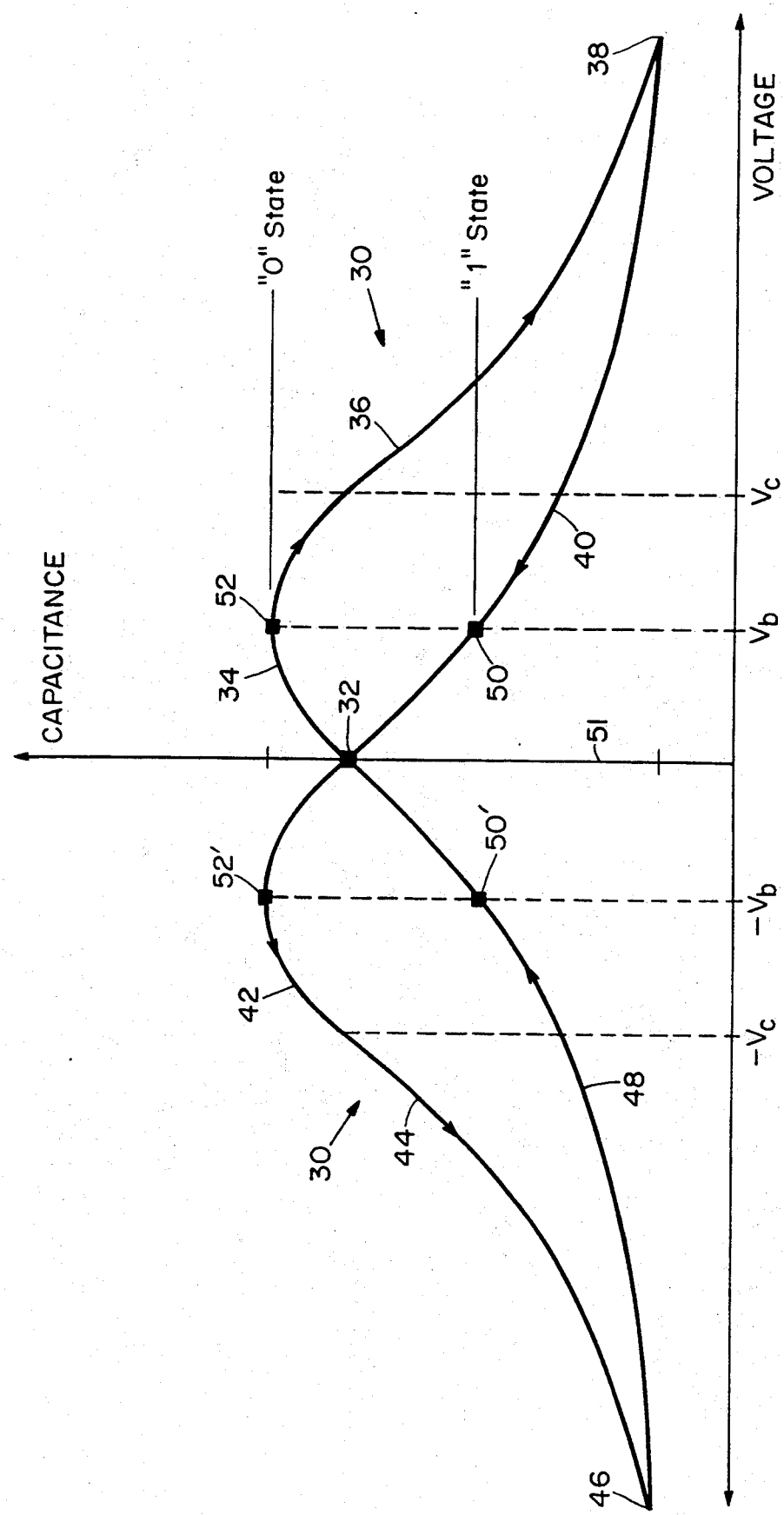
FIG. 2 is an illustration of the capacitance hysteresis characteristics of a prior art ferroelectric capacitance memory device.

In operation, with zero voltage applied across electrodes 14 and 16, the dielectric 12 is in the condition indicated at point 32 in FIG. 2. If the voltage across electrodes 14 and 16 is then increased, the capacitance value of the ferroelectric medium 12 increases up along knee 34 along leg 36 to positive toe 38. If at the point the positive voltage is decreased the capacitance value moves along leg 40 back to point 32. If the voltage is now increased in the negative direction, the capacitance value increases toward knee 42 and then deceases down leg 44 to the negative toe 46. A decrease in the negative voltage now moves the capacitance value along leg 48 back to point 32.

This capacitance hysteresis effect in the dielectric 12 can be utilized as a memory device. For example, if a voltage has been applied at point 32, which drives the capacitance value up over knee 34, down leg 36 to toe 38 and back along leg 40 so that the system has been driven beyond the coercive voltage $V_c$ and back again to the lower, positive bias voltage $V_b$ at point 50 on leg 40, the bit of information has been written into dielectric medium 12. If the voltage across electrodes 14 and 16 is now removed completely so that the system reverts to point 32, ferroelectric medium 12 stores or remembers its last previous condition at point 50. Subsequently, if a bias voltage $V_b$, is applied, ferroelectric medium 12 moves back down leg 40 to point 50. Now a small high-frequency pulse superimposed on $V_b$ at 50 causes a current to flow through medium 12 which is proportional to its capacitance and will thus reflect its polarization condition, which in this case is the polarization condition indicated by the low capacitance level at 50.

If during the write cycle the voltage was driven negative from point 32 over knee 42, down leg 44 to toe 46 back again up leg 48, through zero point 32, to point 52 on knee 34, then when the voltage is removed and the system reverts to point 32, it is the point 52 condition that will be remembered. Thus subsequently when the read bias $V_b$ is applied, the system will move to point 52, which is a much higher capacitive state, indicating the other polarization state. Thus when a small high-frequency read pulse is applied, a higher level of current flow indicating a higher level of capacitance will be indicated.

In FIG. 2, the lower level of capacitance 50 has been labelled the binary one state while the higher level of capacitance 52 has been labelled the zero state. This is arbitrary as the converse denomination could also have been chosen. Similarly, instead of applying a positive bias voltage, the system could work with a negative bias voltage, in which case the capacitive states thus far explained would be reversed, and the "1" and "0" values would be inverted. In either case the bias voltage $V_b$, be it positive or negative, must not exceed the coercive voltage, $V_b$ must be applied at a rate slower than the rate at which the space charge can form, and the read pulse should have a high enough frequency, typically 1000 cycles per second or greater, so that it can induce the current to detect the capacitance level before the space charge distributions can be affected. The signal should be small in magnitude so that it does not exceed the coercive voltage when added to the bias voltage.

Figure 3:
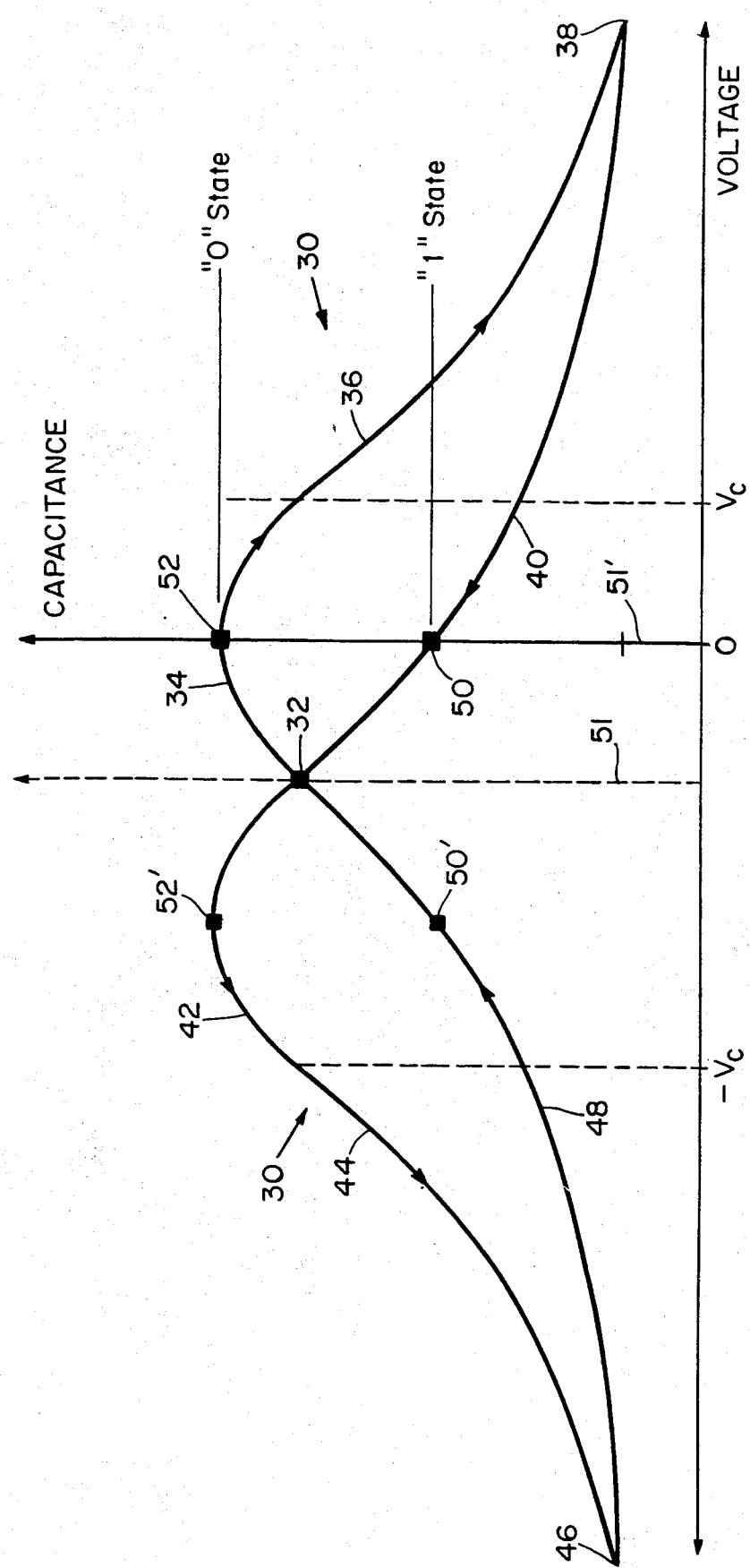
FIG. 3 is an illustration of the capacitance hysteresis characteristics of the self-biased ferroelectric capacitance memory device according to this invention.

In accordance with this invention, the differential internal bias, due to the difference in electric contact potential at junctions 25 and 27, shifts the operating point so that the original quiescent axis 51, FIG. 2, is relocated as the new axis 51', FIG. 3, coincident with the previous position of the external bias voltage $V_b$. The device 10 now operates just as previously but with the exception that it contains a fixed internal bias so that it is always at points 50, 52. No external bias is needed, only a read pulse in order to read out device 10.

Figure 4:
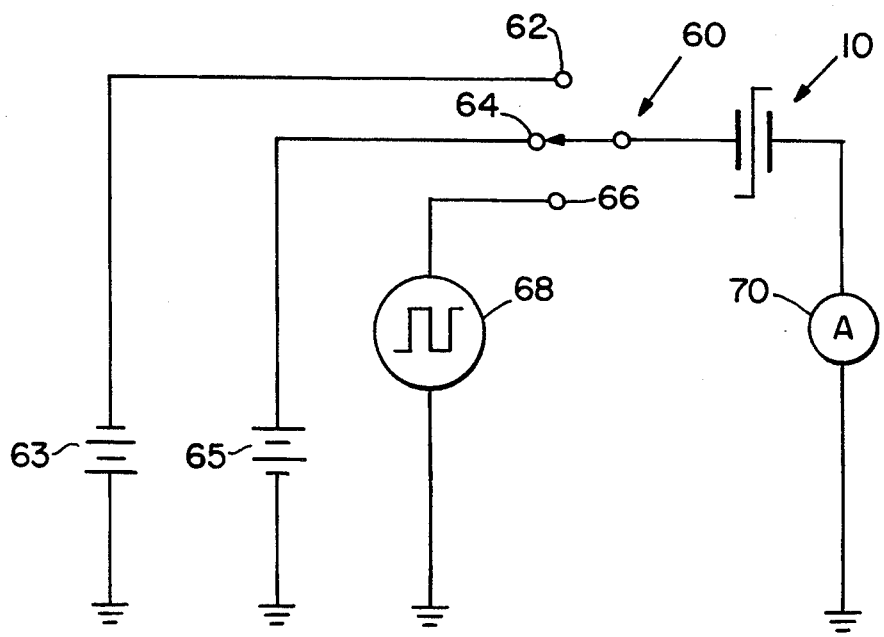
FIG. 4 is a simplified diagram of a write and read circuit usable with the ferroelectric space charge capacitance memory device of FIG. 1.

A simple implementation of a circuit for writing and reading memory device 10, FIG. 1, is shown in FIG. 4, where memory device 10 is connected through a three-way switch 60 to the write 62, 64 and read terminals 66. When switch 60 is connected to terminal 62, negative bias is applied from battery 63 through switch 60 to write a zero into device 10. When switch 60 is connected to terminal 64, a positive bias is applied from battery 65 to device 10 to write a one. Subsequently, when those biases are removed the remanent polarization maintains the one or the zero that was written there. Later, when switch 60 is connected to terminal 66, a small high-frequency pulse is supplied by pulse generator 68 to produce a current flow through device 10 which can be detected by an AC current sensor 70. If the current is low, i.e., the capacitance sensed is low, then that represents a 1 state as explained in FIG. 2. If the current is high, that indicates high capacitance, which represents a zero state.

Figure 5:
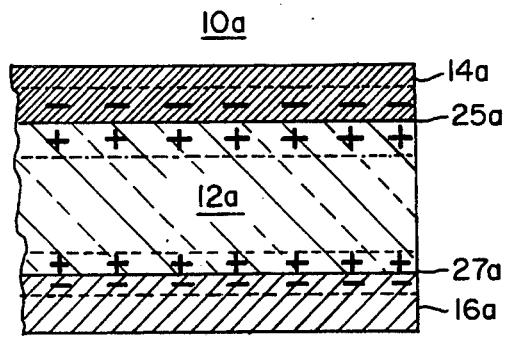
FIG. 5 is a schematic diagram of the ferroelectric space charge capacitance memory device of FIG. 1 showing the difference in electric contact potential between the two electrode dielectric junctions.
Figure 6:
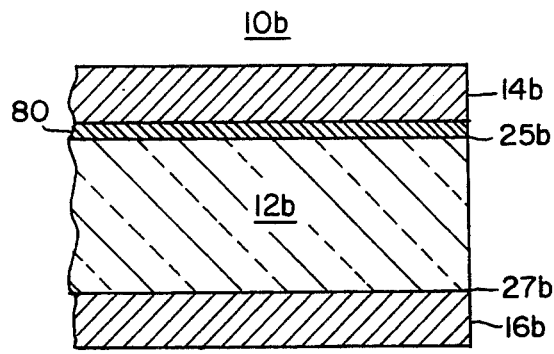
FIG. 6 is a schematic diagram of a portion of the electrode dielectric junction employing a coating on the electrode to obtain the electric contact potential difference.

One way of obtaining a differential internal bias using two different materials which have two different contact potentials for the electrodes is shown with respect to device 10a, FIG. 5. Electrode 14a is platinum, for example, and electrode 16a is gold. This creates a larger contact potential indicated at junction 25a than at junction 27a. The potential difference in such a case will be in the range of 0.2 to 0.4 volts, depending on the crystalline orientation. Alternatively, a separate or auxiliary element in the form of a separate member or coating 80, FIG. 6, can be applied to electrode 14b to provide the differential contact potential between junctions 25b and 27b. In that case electrode 16b could be the same material a electrode 14b, or it could be a different material with different contact potential. Tungsten is one example of a material that could be used for a separate element or coating 80 which would provide a differential in contact potential of up to 1.5 volts if deposited on platinum contacts.

Figure 7:
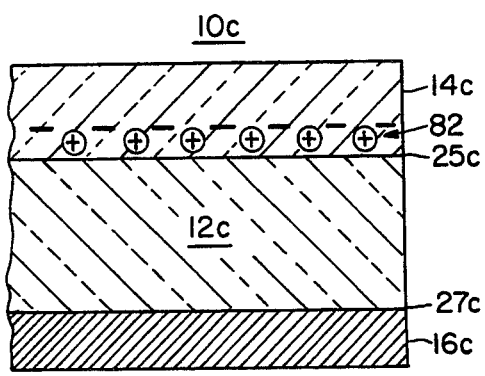
FIG. 7 is a schematic diagram of a portion of the electrode dielectric junction employing a doping of the electrode to obtain the electric contact potential difference.
Figure 8:
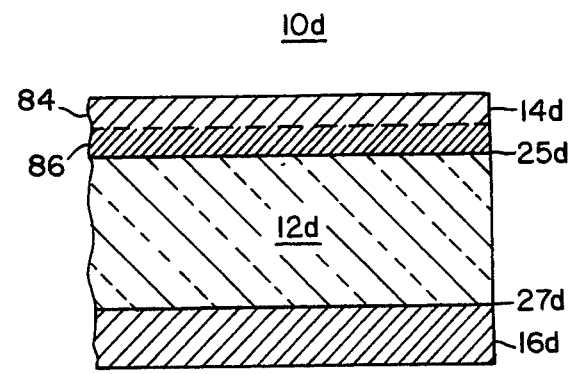
FIG. 8 is a schematic diagram of a portion of the electrode dielectric junction employing a stoichiometric variation of the electrode to obtain the electric contact potential difference.

Alternatively, silicon electrode 14c of device 10c, FIG. 7, may be provided with a dopant 82 of either positive or negative ions to create the electric contact potential difference. Electrode 16c may be the same material, silicon, or it may be another material, and it too could be doped. In another approach, device 10d, FIG. 8, has electrode 14d formed of ruthenium dioxide, $RuO_2$. Thus electrode 14d includes the electrode element 84 of $RuO_2$ and a second element or region 86 which is formed of a similar composition, $RuO_x$, where x is smaller than two so that element or region 86 is richer in ruthenium than element 84. This small stoichiometric difference then provides the difference in electric contact potential between junctions 25d and 27d.

Figure 9:
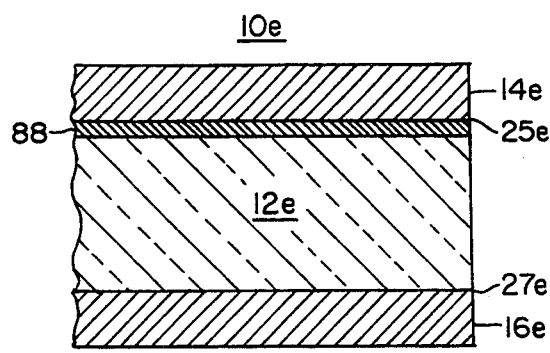
FIG. 9 is a schematic diagram of a portion of the electrode dielectric junction employing a coating of the dielectric to obtain the electric contact potential difference.
Figure 10:
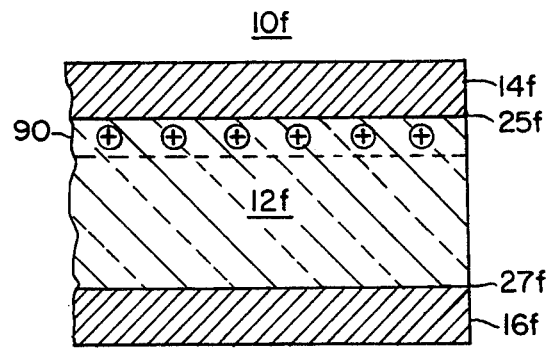
FIG. 10 is a schematic diagram of a portion of the electrode dielectric junction employing a doping of the dielectric to obtain the electric contact potential difference.
Figure 11:
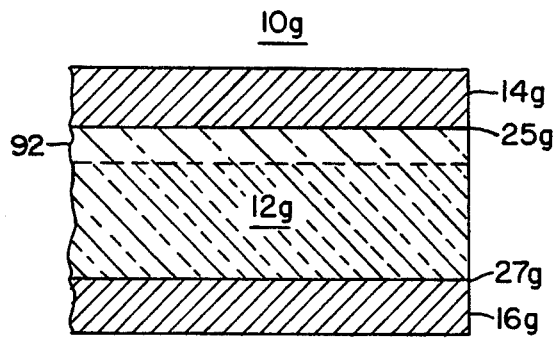
FIG. 11 is a schematic diagram of a portion of the electrode dielectric junction employing a stoichiometric variation of the dielectric to obtain the electric contact potential difference.

Although thus far the modifications have been generally to the electrode material, modifications may as well be made to the dielectric material. Thus as shown in FIG. 9, it is dielectric 12e that carries the additional element or coating 88 of Tungsten, for example, and in FIG. 10 it is the dielectric 12f which contains the lanthanum doping in region 90 of PZT dielectric 12f. The difference may be as subtle as a stoichiometric variation, as shown in FIG. 11, where device 10g has a lead deficiency in layer 92, where the formula for the PZT is $Pb_yZr_xTi_{1-x}O_3$, and $y<1$, as compared to the normal body of the dielectric 12 where the PZT is represented by the normal formula $PbZr_xTi_{1-x}O_3$.

Figure 12:
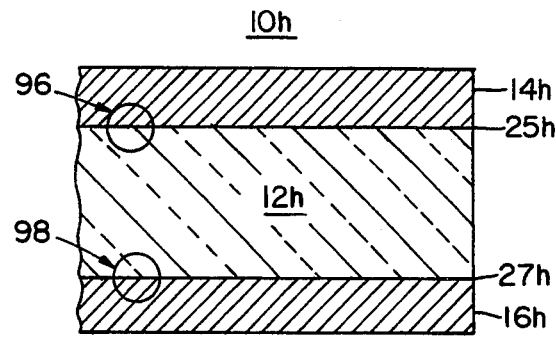
FIG. 12 is a schematic diagram of a portion of the electrode-dielectric junction employing different alloying of the materials at the electrode-dielectric junctions.
Figures 12A, 12B:
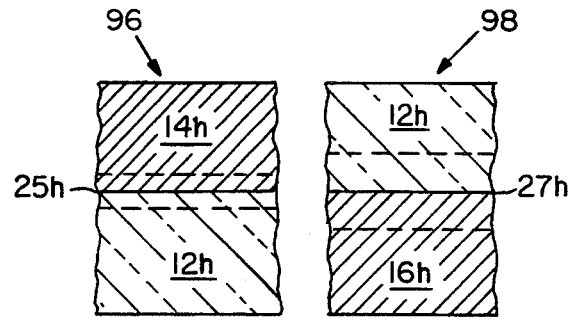
FIGS. 12A and 12B are enlarged detailed drawings of areas 96 and 98 in FIG. 12.
Figure 13:
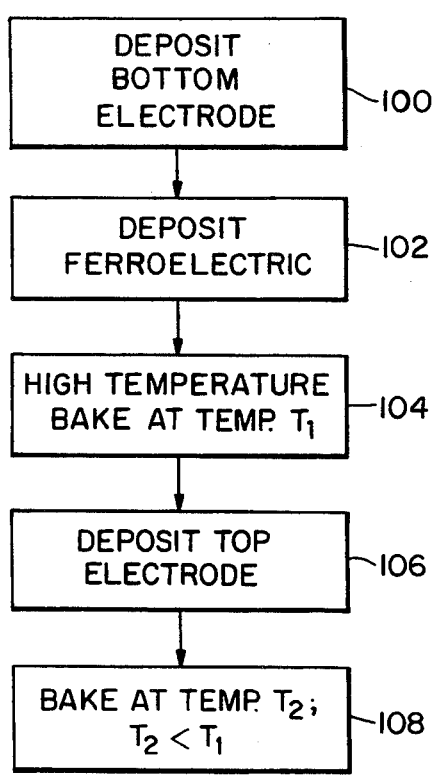
FIG. 13 is a flow diagram of a method for accomplishing the differential alloying depicted in FIG. 12.

In yet another approach to accomplish the same result, different alloying may be promoted at the junctions 25h and 27h of device 10h, FIG. 12, where the junction 25h made of platinum (pictured in the exploded balloon as interface 96 in FIG. 12A) is lightly alloyed, whereas junction 27h (as in the exploded balloon showing interface 98 in FIG. 12B) is heavily alloyed. This, too, provides a difference in electrical contact potential which affects the differential internal bias. Such a difference in alloying can be accomplished, as shown in FIG. 13, by first depositing the bottom electrode, step 100, on a substrate, and then depositing the ferroelectric dielectric device, step 102. After this a high temperature bake is instituted in step 104 which bakes the entire assembly at a first temperature, $T_1$, and then the second electrode is deposited on top in step 106. After this in step 108 the entire structure is baked at a second temperature $T_2$, which is lower than temperature $T_1$. This causes the differential alloying.

Figure 14:
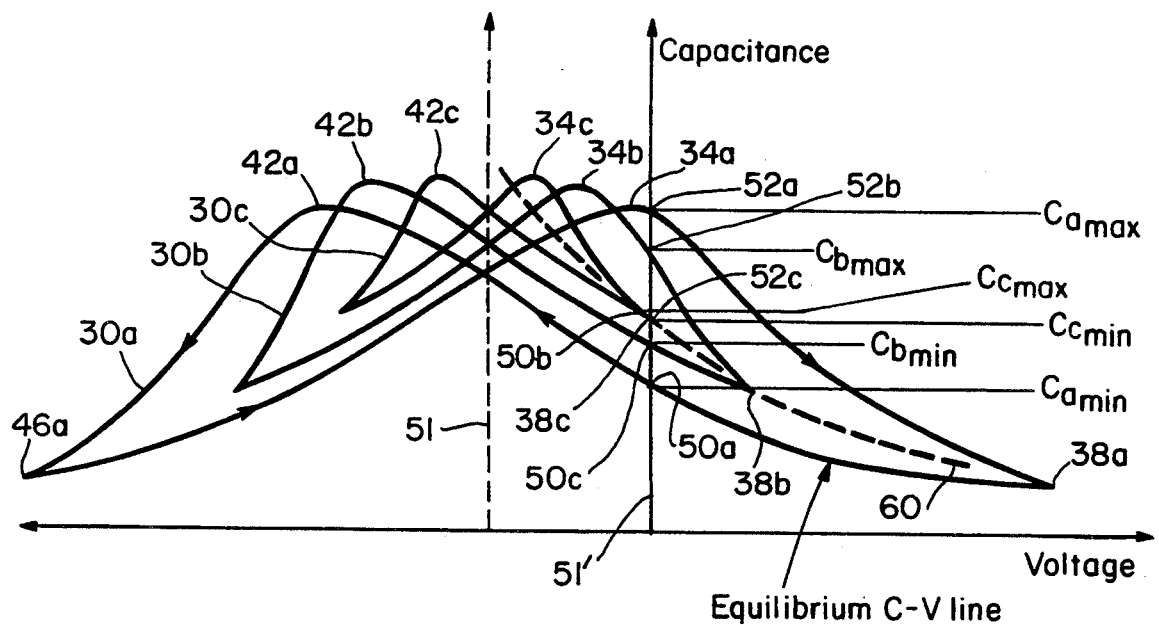
FIG. 14 is an illustration of a family of capacitance hysteresis characteristics of the ferroelectric capacitive memory device according to this invention obtained with various write/coercive voltages for analog memory applications.

The operation of device 10 as an analog memory is achieved by varying the write signal over a range in which the write signal equals or exceeds the coercive voltage to obtain a family of hysteresis characteristics similar to characteristic 30 of FIGS. 2 and 3. Characteristics 30a, b and c, FIG. 14, are each obtained in the same way but using a slightly lower write voltage each time. As the write voltage decreases the peak capacitance increases, as can be seen by comparing peaks 34a and 42a with 34b and 42b, and further with peaks 34c and 42c. Also note that the peaks within each characteristic come closer together as the voltage deceases and the capacitance increases. Thus peaks 30c and 42c are closer together than peaks 34b and 42b, which are closer than peaks 34a and 42a. All of the end points of the hysteresis 38a, 38b, 38c obtained at the various write voltages lie along equilibrium line 60 which is the path initially tracked by the characteristics during the initialization in the unpolarized state. In a digital memory application the data is stored in a binary form that corresponds to either the maximum positive or maximum negative of the plurality of polarized states. In an analog memory application the whole range of the plurality of polarized states from maximum negative to maximum positive is used to store different amplitudes of the analog signal.

In FIG. 14 the external bias $V_b$ is no longer needed as the origin 51 has been shifted to coincide with the previous location of the extend bias $V_b$ at 51'.

When read out, it can be seen that characteristic 30a will provide a capacitance for either $C_{a\,max}$ or $C_{a\,min}$ depending upon the point along the hysteresis facilitated by the write signal. For a lower voltage write signal, the options become $C_{b\,max}$ and $C_{b\,a\,min}$. For even lower write voltage, the options for the capacitance values are $C_{c\,max}$ and $C_{c\,min}$. Thus by simply varying the voltage applied to establish the internal polarization field, a virtually infinite number of characteristics 30 with their attendant maximum and minimum capacitance values can be obtained at a single bias point such as $V_b$.

Figure 15:
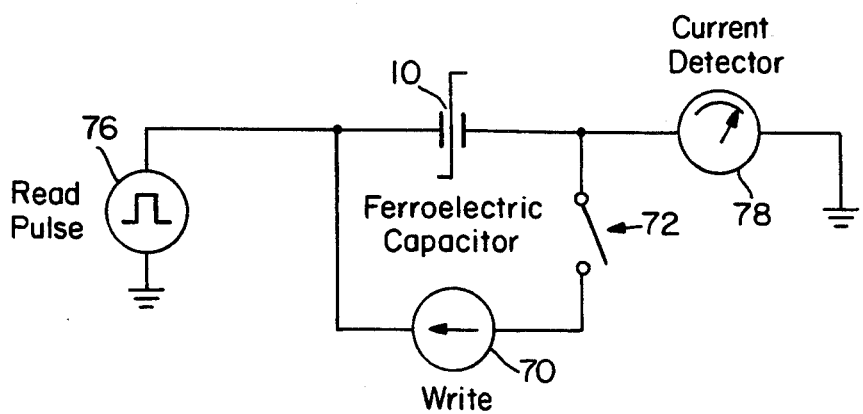
FIG. 15 is a simple ferroelectric memory circuit using a single ferroelectric capacitance memory device in an analog application according to this invention.

A circuit which employs this feature may simply contain a write signal source 70, FIG. 15, connected in series with switch 72, in parallel with ferroelectric capacitor device 10. When switch 72 is closed, device 10 will have an internal field established in it as a function of the charge transferred from write signal source 70. This is directly related to the current from source 70 times the time that the current is allowed to flow. When the time is kept constant, as it normally would in establishing a family of curves 30a–c as shown in FIG. 14, it is the value of the current or the voltage provided by source 70 which determines the value that is stored in device 10. Subsequently, when it is desired to read out the analog values stored in device 10, a short high-frequency read pulse from source 76 superimposed on the internal bias voltage quickly reads out the polarization field in device 10 without disturbing that field. The current passed to current detector 78 is directly a function of the capacitance of device 10, which in turn is a function of the internal field which has ben induced in it by the write signal from source 70.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. A self-biased ferroelectric space charge capacitor memory device having a plurality of polarization states represented by a like plurality of different capacitive levels comprising:

a ferroelectric dielectric having a coercive voltage, plurality of polarization states, and a positive and negative poles;

a first electrode attached to said dielectric and a second electrode spaced from said first electrode and attached to said dielectric;

self biasing means, intrinsic to the structure of the electrodes and the dielectric, for providing a differential contact electrical potential between each of the two electrodes and the dielectric which defines two capacitive levels, one representative of each of two polarization states, and produces an electric field which is less than a coercive electric field of said dielectric;

means for applying a coercive voltage to said dielectric to write said dielectric into one of two polarization states and to establish in each polarization state proximate the interface between said dielectric and each electrode a space charge region having a charge opposite to that applied to the electrode with a neutral region between the space charge regions, the relative sizes of said neutral and space charge regions defining the capacitance of the dielectric, said neutral region having an internal polarization field opposite to that represented by the space charge regions;

means for introducing to said dielectric a read signal at a rate faster than the rate of space charge formation which together with the internal bias voltage is less than the coercive voltage; and means, responsive to the introduction of the read signal to said dielectric, for determining the capacitance level representative of one of said polarization states.

2. The ferroelectric space charge capacitor memory device of claim 1 in which said means for determining the capacitance includes means for detecting the displacement current transferred through said dielectric in response to said read signal.

3. The ferroelectric space charge capacitor memory device of claim 1 in which said two polarization states include a first state in which the positive pole of the dielectric is proximate said first electrode and the negative pole is proximate said second electrode, and a second state in which the negative pole of the dielectric is proximate said first electrode and the positive pole is proximate said second electrode.

4. The ferroelectric space charge capacitor memory device of claim 1 in which said internal bias voltage establishes an electric field that increases the internal electric field of the dielectric and the size of said space charge region with a concomitant decrease in capacitance when it is additive with said internal polarization field, and decreases said internal electric field and the size of said space charge region with a concomitant increase in capacitance when it is subtractive with said internal polarization field.

5. The ferroelectric space charge capacitor memory device of claim 1 in which said read signal momentarily induces through said dielectric a displacement current which is proportional to the capacitance representative of the polarization state of said dielectric.

6. The ferroelectric space charge capacitor memory device of claim 1 in which said electrodes are metal and said space charge regions are in said dielectric.

7. The ferroelectric space charge capacitor memory device of claim 1 in which said electrodes are semiconductors and said space charge regions are at least partially in said electrodes.

8. The ferroelectric space charge capacitor memory device of claim 1 in which said self biasing means includes first and second electrode elements applied to said first and second electrodes, respectively, which are of dissimilar material and have dissimilar contact potentials.

9. The ferroelectric space charge capacitor memory device of claim 1 in which said self biasing means includes first and second electrode elements, applied to said first and second electrodes, respectively, and at least one of said electrodes includes an auxiliary element of dissimilar material between said electrode element and dielectric to differentiate the contact potential from that of the other electrode.

10. The ferroelectric space charge capacitor memory device of claim 1 in which said self biasing means includes an electrode element for at least one of said electrodes with a coating contacting said dielectric for establishing an electric contact potential different from that of the other electrode.

11. The ferroelectric space charge capacitor memory device of claim 1 in which said self biasing means includes at least one of said electrodes having an electrode element with a surface dopant contacting said dielectric for establishing an electric contact potential different from that of the other electrode.

12. The ferroelectric space charge capacitor memory device of claim 1 in which said self biasing means includes at least one of said electrodes having an electrode element having a region of altered stoichiometry.

13. The ferroelectric space charge capacitor memory device of claim 1 in which said self biasing means includes at least one surface of said dielectric engaged with one of said electrodes having a coating contacting said electrode for establishing an electric contact potential different from that of the other electrode.

14. The ferroelectric space charge capacitor memory device of claim 1 in which said self biasing means includes, on at least one surface of said dielectric engaged with one of said electrodes, a surface dopant contacting said electrode for establishing an electric contact potential different from that of the other electrode.

15. The ferroelectric space charge capacitor memory device of claim 1 in which said self biasing means includes, on at least one surface of said dielectric engaged with one of said electrodes, a region of altered stoichiometry for establishing an electric contact potential different from that of the other electrode.

16. The ferroelectric space charge capacitor memory device of claim 1 in which said self biasing means includes electrodes differentially alloyed to said dielectric for establishing a different electric contact potential at each said electrode.

17. A ferroelectric space charge capacitor memory device comprising:
a ferroelectric dielectric having a coercive voltage, a plurality of polarization states and positive and negative poles;
a first electrode attached to said dielectric and a second electrode spaced from said first electrode and attached to said dielectric;
self biasing means, intrinsic to the structure of the electrodes of the dielectric, for providing a differential contact electrical potential between each of the two electrodes and the dielectric for establishing a differential internal bias voltage in said dielectric which defines a number of capacitive levels, one representative of each of the corresponding number of polarization states and produces an electric field which is less than a coercive electric field of said dielectric;
means for applying a write signal equal to or greater than the coercive voltage of said dielectric to write said dielectric into a predetermined polarization state in the range from zero to maximum coerced polarization and to establish proximate the interface between said dielectric and each electrode a space charge region having a charge opposite to that applied to the electrode with a neutral region between the space charge regions, the relative sizes of said neutral and space charge regions defining the capacitance of the dielectric, said neutral region having an internal polarization field opposite to that represented by the space charge regions;
means for introducing to said dielectric a read signal at a rate faster than the rate of space charge formation which together with the internal bias voltage is less than the coercive voltage; and
means, responsive to the introduction of the read signal to said dielectric, for determining the capacitance level representative of one of said predetermined polarization states.

18. The ferroelectric space charge capacitor memory device of claim 17 in which said means for determining the capacitance includes means for detecting the displacement current transferred through said dielectric in response to said read signal.

19. The ferroelectric space charge capacitor device of claim 17 in which said means for applying includes means for varying the charge transferred by said write signal to vary the size of the space charge regions, the capacitance of the neutral region, and the polarization of the dielectric.

20. The ferroelectric space charge capacitor memory device of claim 17 in which said means for varying includes means for changing the magnitude of said write signal.

21. The ferroelectric space charge capacitor memory device of claim 17 in which said internal bias voltage establishes an electric field that increases said internal electric field and the size of said space charge region with a concomitant decrease in capacitance when it is additive with said internal polarization field, and decreases said internal electric field and the size of said space charge region with a concomitant increase in capacitance when it is subtractive with said internal polarization field.

22. The ferroelectric space charge capacitor memory device of claim 17 in which said read signal momentarily induces through said dielectric a displacement current which is proportional to the capacitance representative of the polarization state of said dielectric.

23. The ferroelectric space charge capacitor memory device of claim 17 in which said electrodes are metal and said space charge regions are in said dielectric.

24. The ferroelectric space charge capacitor memory device of claim 17 in which said electrodes are semiconductors and said space charge regions are at least partially in said electrodes.

25. The ferroelectric space charge capacitor memory device of claim 17 in which said self biasing means includes first and second electrode elements for said first and second electrodes, respectively, which are of dissimilar material and have dissimilar contact potentials.

26. The ferroelectric space charge capacitor memory device of claim 17 in which said self biasing means includes first and second electrode elements, for said first and second electrodes respectively, and at least one of said electrodes includes an auxiliary element of dissimilar material between said electrode element and said dielectric to differentiate the contact potential from that of the other electrode.

27. The ferroelectric space charge capacitor memory device of claim 17 in which said self biasing means includes at least one of said electrodes having an electrode element with a coating contacting said dielectric for establishing an electric contact potential different from that of the other electrode.

28. The ferroelectric space charge capacitor memory device of claim 17 in which said self biasing means includes at least one of said electrodes having an electrode element with a surface dopant contacting said dielectric for establishing an electric contact potential different from that of the other electrode.

29. The ferroelectric space charge capacitor memory device of claim 17 in which said self biasing means includes at least one of said electrodes having an electrode element including a region of altered stoichiometry.

30. The ferroelectric space charge capacitor memory device of claim 17 in which said self biasing means includes, on at least one surface of said dielectric engaged with one of said electrodes, a coating contacting said electrode for establishing an electric contact potential different from that of the other electrode.

31. The ferroelectric space charge capacitor memory device of claim 17 in which self biasing means includes, on at least one surface of said dielectric engaged with one of said electrodes, a surface dopant contacting said electrode for establishing an electric contact potential different from that of the other electrode.

32. The ferroelectric space charge capacitor memory device of claim 17 in which self biasing means includes, on at least one surface of said dielectric engaged with one of said electrodes, a region of altered stoichiometry for establishing an electric contact potential different from that of the other electrode.

33. The ferroelectric space charge capacitor memory device of claim 17 in which said self biasing means includes electrodes differentially alloyed to said dielectric for establishing a different electric contact potential at each said electrode.

* * * * *